United States Patent
Igarashi

(10) Patent No.: US 7,269,200 B2
(45) Date of Patent: Sep. 11, 2007

(54) FREQUENCY HOPPING COMMUNICATION DEVICE WITH SIMPLE STRUCTURE

(75) Inventor: Katsuhito Igarashi, Tokyo (JP)

(73) Assignee: NEC Corporation, Tokyo (JP)

( * ) Notice: Subject to any disclaimer, the term of this patent is extended or adjusted under 35 U.S.C. 154(b) by 789 days.

(21) Appl. No.: 10/386,273

(22) Filed: Mar. 11, 2003

(65) Prior Publication Data

US 2004/0005866 A1 Jan. 8, 2004

(30) Foreign Application Priority Data

Mar. 11, 2002 (JP) .............................. 2002-064825

(51) Int. Cl.
*H04B 1/69* (2006.01)

(52) U.S. Cl. ..................................... 375/135
(58) Field of Classification Search ................. 375/135, 375/132
See application file for complete search history.

(56) References Cited

U.S. PATENT DOCUMENTS 6,731,101 B2 * 5/2004 Miyagawa et al. ...... 324/76.79
6,763,055 B1 * 7/2004 Fry .............................. 375/132

FOREIGN PATENT DOCUMENTS

JP 1-243730 9/1989
JP 9-139694 5/1997
JP 11-274951 10/1999

* cited by examiner

*Primary Examiner*—Khai Tran
(74) *Attorney, Agent, or Firm*—Scully, Scott, Murphy & Presser, P.C.

(57) ABSTRACT

A frequency hopping communication device has a memory memorizing modulation coefficients related to hopping frequencies of a carrier wave. Whenever a following hopping frequency is decided, a CPU reads out one of the modulation coefficients on the basis of the following hopping frequency from the memory and supplies it to a Gaussian filter. The Gaussian filter stores the read out modulation coefficient in a register and multiplies transmission data signal supplied thereto by the read out modulation coefficient stored in the register to produce a modulation signal. Thus, the modulation signal has voltage amplitude depending on the carrier frequency. A voltage controlled oscillator modulates the carrier wave having the following hopping frequency by the use of the modulation signal from the Gaussian filter and produces a transmission signal. Therefore, the transmission signal has an approximately uniform frequency deviation regardless of the carrier frequency.

9 Claims, 12 Drawing Sheets

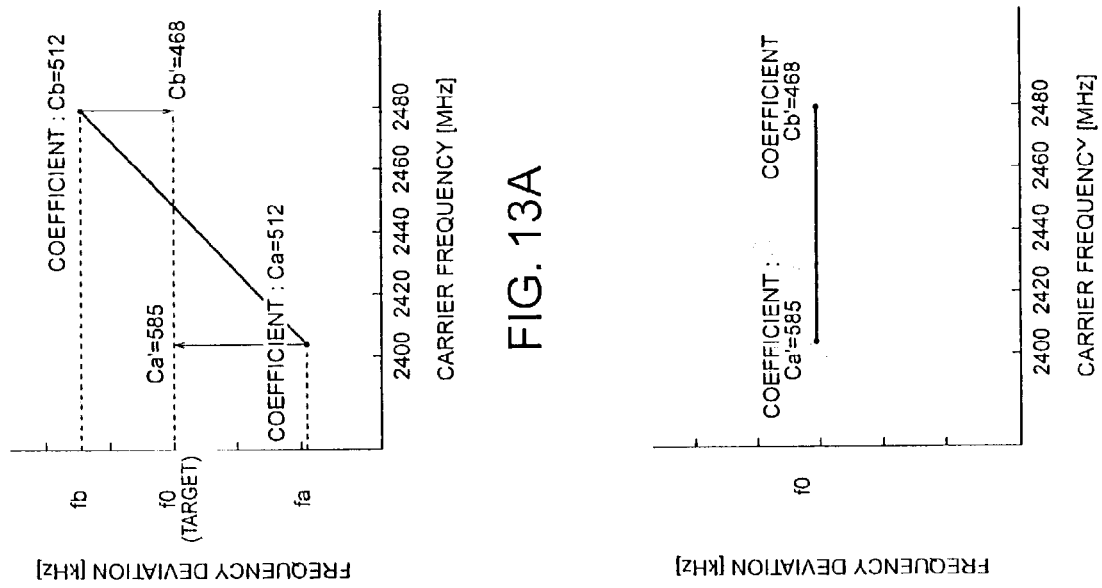
FIG. 13A
FIG. 13B
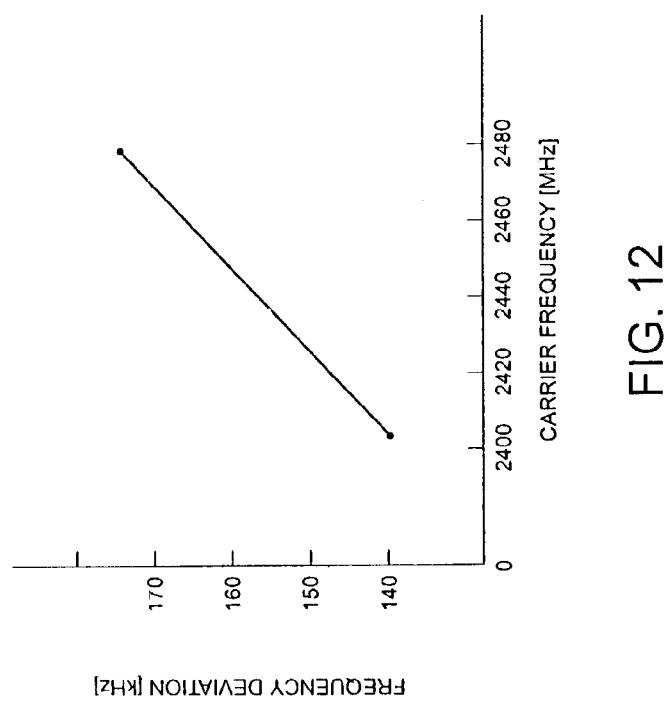
FIG. 12

| WRITE INSTRUC-TION | WRITE DATA LENGTH DESIGNA-TION | START ADDRESS DESIGNA-TION | COEFFICI-ENT FOR 2402MHz | COEFFICI-ENT FOR 2403MHz | COEFFICI-ENT FOR 2404MHz | ...... | COEFFICI-ENT FOR 2479MHz | COEFFICI-ENT FOR 2480MHz |
|---|---|---|---|---|---|---|---|---|

FREQUENCY HOPPING COMMUNICATION DEVICE WITH SIMPLE STRUCTURE

This application claims priority to prior application JP 2002-064825, the disclosure of which is incorporated herein by reference.

BACKGROUND OF THE INVENTION

This invention relates to a frequency hopping spectrum spreading communication device, particularly, to a spectrum spreading GFSK (Gaussian Frequency Shift Keying) communication device capable of maintaining approximately uniform frequency deviation regardless of a carrier frequency.

Generally, a GFSK communication device comprises a VCO (Voltage Controlled Oscillator) to produce a modulated carrier wave as a transmission signal. The VCO is not only used for modulating a carrier wave but also for executing frequency hopping of the carrier wave.

The transmission signal must have frequency deviation restricted within prescribed limits. If a carrier frequency of the carrier wave is fixed, it is easy to restrict the frequency deviation within the prescribed limits. That is, amplitude of modulation voltage supplied to the VCO has only to be restricted within a desirable range in this case.

However, the carrier frequency hops (changes or switches) frequently and takes any one of predetermined hopping frequencies in actuality. In such a case, if the amplitude of the modulating voltage is fixed, the frequency deviation changes according to the change or hopping of the carrier frequency. In other words, the VCO has frequency deviation characteristics depending on the carrier frequency.

A related GFSK communication device comprises a frequency deviation correcting circuit to restrict the frequency deviation within the prescribed limits.

However, the frequency deviation correcting circuit has a complicated structure. For instance, the frequency deviation correcting circuit comprises resistors and switches connected to the resistors respectively. Moreover, it is difficult to control the frequency deviation correcting circuit because there are many combinations of ON/OFF state of the switches.

SUMMARY OF THE INVENTION

It is therefore an object of this invention to provide a frequency hopping (spectrum spreading GFSK) communication device with a simple structure which is capable of restricting frequency deviation within prescribed limits regardless of a carrier frequency.

Other object of this invention will become clear as the description proceeds.

According to a first aspect of this invention, a frequency hopping communication device includes a voltage controlled oscillator to produce a modulated signal that a carrier wave is modulated by a modulation signal. The carrier wave has a carrier frequency changed into any one of hopping frequencies at regular intervals. The frequency hopping communication device comprises a memory for memorizing a plurality of modulation coefficients related to the hopping frequencies. A control unit is connected to the memory. The control unit reads out one of the modulation coefficients as a read out modulation coefficient on the basis of a following hopping frequency from the memory when the following hopping frequency is decided. An adjusting portion is connected to the control unit and the voltage controlled oscillator. The adjusting portion adjusts voltage amplitude of the modulation signal by the use of the read out modulation coefficient to restrict frequency deviation of the modulated signal within a predetermined range regardless of the carrier frequency.

According to a second aspect of this invention, a method is for restricting frequency deviation of a transmission signal transmitted from a frequency hopping communication device within a predetermined range regardless of hopping frequencies. The frequency hopping communication device includes a voltage controlled oscillator to produce a modulated signal that a carrier wave is modulated by a modulation signal. The carrier wave has a carrier frequency changed into any one of hopping frequencies at regular intervals. The method comprises the steps of memorizing a plurality of modulation coefficients related to the hopping frequencies; reading out one of the modulation coefficients as a read out modulation coefficient on the basis of a following hopping frequency from the memory when the following hopping frequency is decided; and adjusting voltage amplitude of the modulation signal by the use of the read out modulation coefficient to restrict frequency deviation of the modulated signal within a predetermined range regardless of the carrier frequency.

According to a third aspect of this invention, a method is for finding modulation coefficients related to hopping frequencies. The modulation coefficients are used for restricting frequency deviation of a transmission signal transmitted from a frequency hopping communication device within a predetermined range regardless of a carrier frequency. The frequency hopping communication device includes a voltage controlled oscillator to produce a modulated signal that a carrier wave with the carrier frequency is modulated by a modulation signal. The carrier frequency is changed into any one of hopping frequencies at regular intervals. The method comprises the steps of connecting a measuring computer and a frequency deviation measuring unit with the frequency hopping communication device; directing, from the computer, the frequency hopping communication device to maintain one of the hopping frequencies as a first carrier frequency; transmitting, from the frequency hopping communication device to the frequency deviation measuring unit, a first transmission signal that the first carrier frequency is modulated by the use of a predetermined pattern signal; measuring, at the frequency deviation measuring unit, frequency deviation of the first transmission signal to obtain a first result; directing, from the computer, the frequency hopping communication device to maintain another one of the hopping frequencies as a second carrier frequency; transmitting, from the frequency hopping communication device to the frequency deviation measuring unit, a second transmission signal that the second carrier frequency is modulated by the use of the predetermined pattern signal; measuring, at the frequency deviation measuring unit, frequency deviation of the second transmission signal to obtain a second result; and calculating the modulation coefficients by the use of linear interpolation using the first carrier frequency, the first result, the second carrier frequency and the second result.

BRIEF DESCRIPTION OF THE DRAWING

FIG. 12 is a graph for describing liner interpolation for measuring results obtained by the measuring system of FIG. 9;

FIG. 13A is a graph for describing calibration against a result of the interpolation;

FIG. 13B is a graph showing a result of the calibration;

DESCRIPTION OF THE PREFERRED EMBODIMENT

Figure 3:
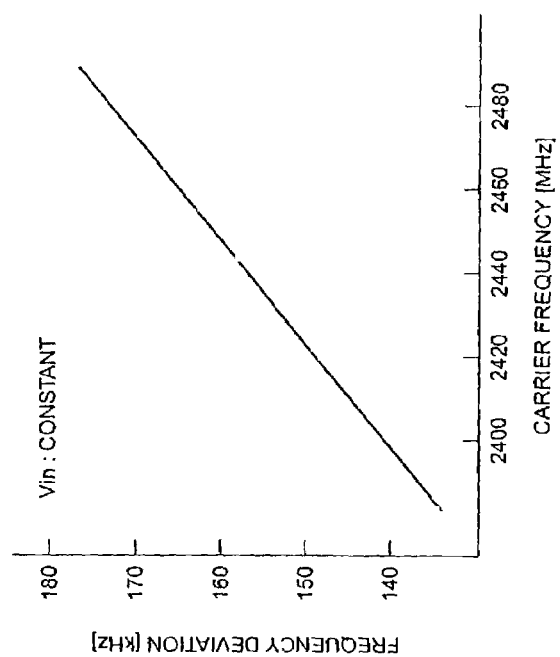
FIG. 3 is a graph of the frequency deviation against carrier frequency.
Figure 1:
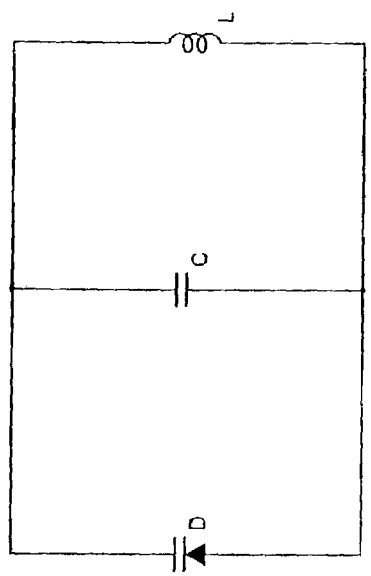
FIG. 1 shows a circuit diagram of a principal part of a conventional voltage controlled oscillator.
Figure 2:
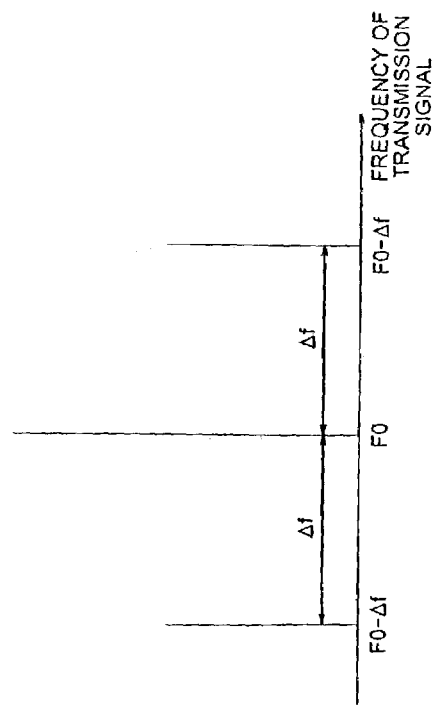
FIG. 2 shows a schematic diagram for describing frequency deviation.

Referring to FIGS. 1 to 3, description will be at first directed to a conventional frequency hopping GFSK (Gaussian Frequency Shift Keying) communication device. The GFSK communication device may be referred to as a frequency hopping GFSK modulation wireless device.

The conventional GFSK communication device comprises a VCO (Voltage Controlled Oscillator) which changes its oscillation frequency according to input voltage supplied thereto. In the GFSK communication device, GFSK modulation is executed by the use of the VCO. That is, the oscillation frequency of the VCO is changed by modulation voltage (or a baseband signal, or a modulation signal) supplied to VCO. The modulation voltage corresponds to transmission digital codes.

The VCO comprises an LC circuit including a varactor (with capacitance D) shown in FIG. 1 for instance. The oscillation frequency "F" of the VCO is given by an equation: $F=1/2\pi\sqrt{(L(C+D))}$. The oscillation frequency is adjusted by changing the capacitance D of the varactor. Concretely, when reverse voltage impressed to the varactor becomes small, the capacitance D becomes large and the oscillation frequency becomes low. Oppositely, when the reverse voltage impressed to the varactor becomes large, the capacitance D becomes small and the oscillation frequency becomes high.

By the way, to execute spectrum spreading GFSK communication actually, frequency deviation (frequency deviation width or frequency deviation amount) of a transmission signal (a modulated carrier wave or a GFSK wave) must be in the prescribed range prescribed by its communication standards. For instance, Bluetooth standards restrict the frequency deviation within the range of 140-175 kHz. In other words, a modulation index is restricted within the range of 0.28-0.35 by the Bluetooth standards. The restriction is based on the reason as follows.

When the frequency deviation of the GFSK wave becomes small, difference between frequencies corresponding to digital codes "0" and "1" of the GFSK wave becomes small. Consequently, it becomes difficult to distinguish demodulated digital codes "0" and "1" from each other in a receiver. Moreover, when the frequency deviation is so large that the frequency of the GFSK wave exceeds a frequency band assigned thereto, the GFSK wave interferes with adjacent channel GFSK waves. In consequence, serious failure is caused in a communication system including the communication device.

Additionally, the frequency deviation represents difference "Δf" between the carrier frequency (center frequency "F0") and a frequency ("F0+Δf") corresponding to "1" of binary data of the transmission signal (or modulated carrier wave) or a frequency ("F0−Δf") corresponding to "0" as illustrated in FIG. 2.

On a condition that the carrier frequency is fixed, the frequency deviation of the transmission signal is restricted within the prescribed range by restricting voltage amplitude of the modulating signal within a predetermined range. However, the VCO not only modulates the carrier wave but also executes frequency hopping of the carrier wave in the spectrum spreading GFSK modulation wireless device. Accordingly, there is a possibility that the frequency deviation exceeds the prescribed range in the GFSK modulating wireless device although the amplitude of the modulating signal is restricted within the predetermined range.

In the GFSK modulation wireless device which executes the spectrum spreading, the capacitance D of the varactor is changed to execute not only the modulation but also the frequency hopping. In a word, the capacitance D is reduced to increase the carrier frequency, and the capacitance D is enlarged to decrease the carrier frequency. Here, it is assumed that the varactor has the capacitance "Dh" and "Dl" when the carrier frequency is equal to higher and lower hopping frequencies respectively. In this case, an inequality of "Dh<Dl" is held. If the voltage amplitude of the modulating signal is fixed, capacitance variation ΔD caused by the modulating signal in the varactor is constant regardless of the capacitance D. Therefore, an inequality of "ΔD/Dh>ΔD/Dl" is held. The inequality means that the frequency deviation becomes large when the carrier frequency becomes high on condition that the modulating signal has the fixed voltage amplitude. In a word, the frequency deviation of the transmission signal changes according to change of the carrier frequency in the VCO which executes the frequency hopping when the amplitude of the modulation voltage is fixed. Thus, there is a possibility that restriction of the amplitude of the modulation voltage within the predetermined range can not restrict the frequency deviation within the prescribed range in dependence on the carrier frequency in the GFSK modulating wireless device.

FIG. 3 shows an example of a result of measuring relation between the carrier frequency and the frequency deviation in the case where the voltage amplitude of the modulation signal impressed to the VCO is constant.

A related spectrum spreading GFSK communication device comprises a maximum frequency deviation correcting circuit as disclosed in Unexamined Japanese Patent Publication No. Hei 1(1989)-243730. The maximum frequency deviation correcting circuit adjusts the voltage amplitude of the modulation signal according to the carrier frequency to roughly compensate frequency characteristics of the VCO and to roughly equalize the frequency deviation of the transmission signal.

Figure 4:
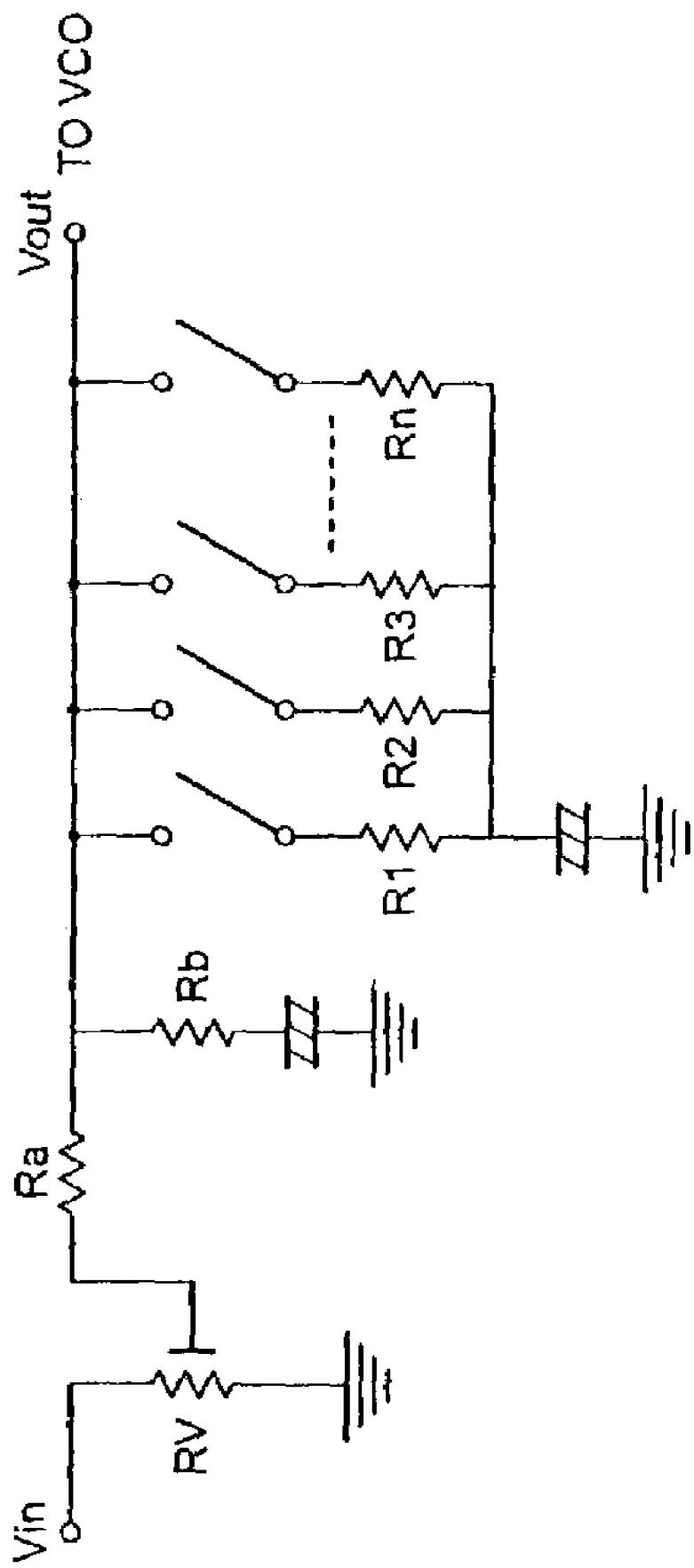
FIG. 4 is a circuit diagram of a maximum frequency deviation correcting circuit provided in a related spectrum spreading GFSK communication device.

Concretely, the maximum frequency deviation correcting circuit comprises plurality of resistors R1 to Rm and switches as illustrated in FIG. 4. One end of each resister is connected to each switch while the other end is grounded through a capacitor. The switches are further connected to an output terminal connected to the VCO.

The maximum frequency deviation correcting circuit receives a VCO control signal Vin including the modulation signal at an input terminal and supplies a corrected or adjusted VCO control signal Vout to the VCO through the output terminal. The maximum frequency deviation correcting circuit controls an on/off state of each switch on the basis of the carrier frequency to adjust the VCO control signal.

The maximum frequency deviation correcting circuit has a complicated structure because of the resistors and the switches. Furthermore, it is hard to decide combinations of on state switches for each hopping frequency. The control of the switches is also complicated.

In addition, the maximum frequency deviation correcting circuit can not cope with production variation of the VCO and change or modification of communication standards. This is because the resistors have resistance decided on the assumption that the VCO has known-modulation sensitivity and that correction amount for the frequency deviation can be uniquely decided. A technique to cope with the production variation of the VCO is disclosed in Unexamined Japanese Patent Publication No. Tokkaihei 11(1999)-274951. However, the technique is for a wireless device that carrier frequency is fixed. In the technique, a nonvolatile memory memorizes only three data sets. One of the data sets is for deciding a carrier frequency. The remaining two data sets are for modulating the carrier frequency according to binary "0" and "1". The Publication does not disclose or teach frequency hopping of a carrier wave and change of frequency deviation according to the carrier wave (or the frequency hopping).

Figure 5:
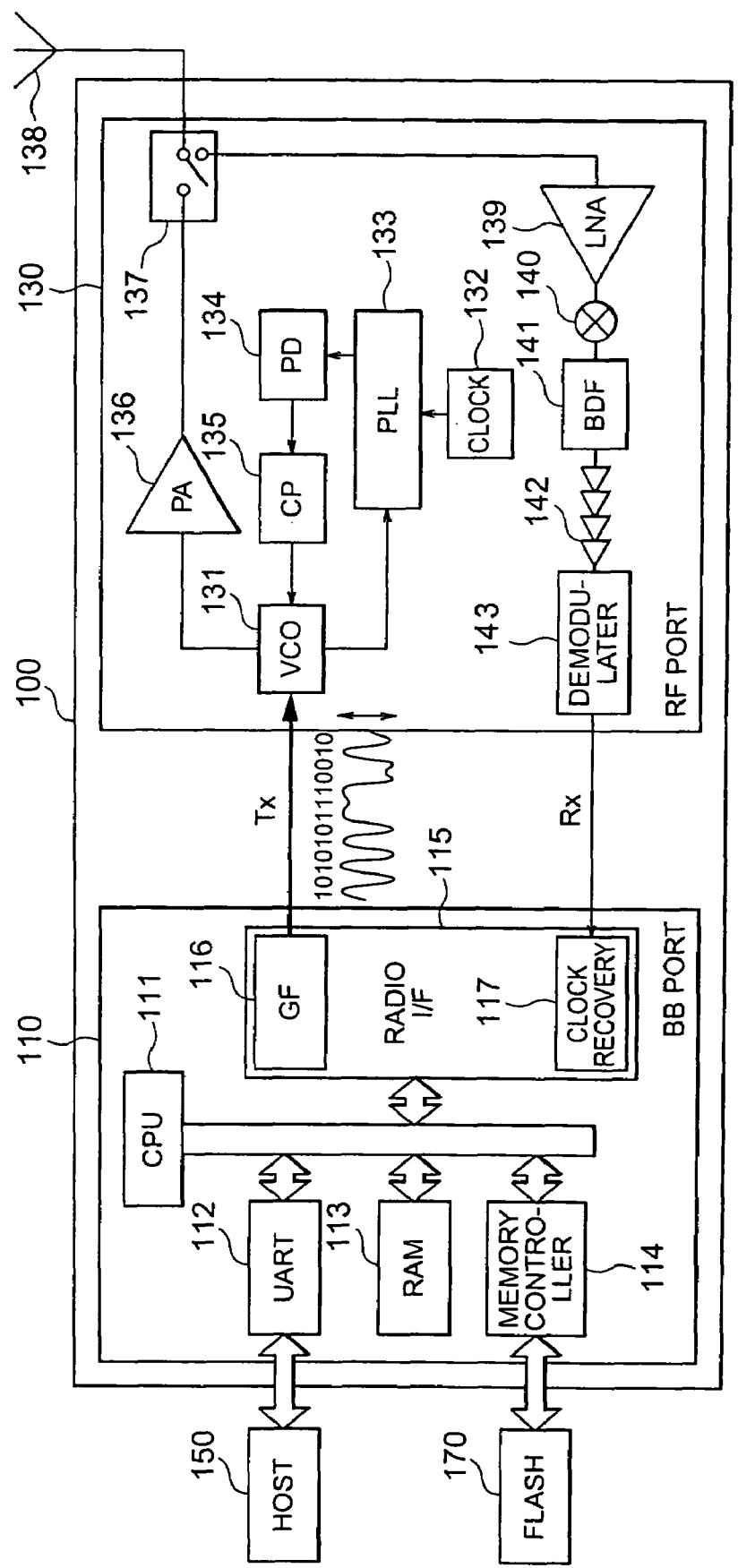
FIG. 5 is a block diagram of a frequency hopping spectrum spreading GFSK communication device according to a preferred embodiment of this invention.
Figure 22:
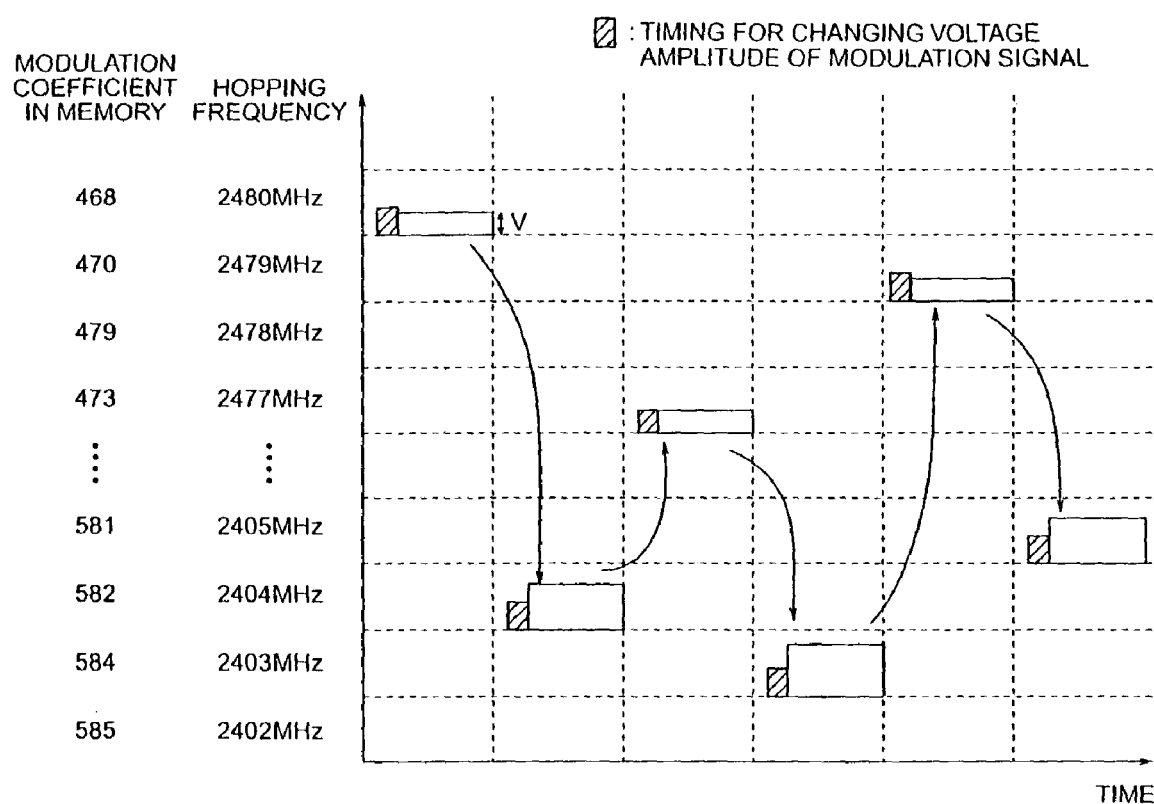
FIG. 22 is a timing chart for describing an operation of reading out the modulation coefficient corresponding to the following hopping frequency.

Referring to FIGS. 5 and 22, the description will proceed to a spectrum spreading GFSK wireless communication device according to a preferred embodiment of this invention.

FIG. 5 is a block diagram showing a structure of the spectrum spreading GFSK wireless communication device. The shown device 100 comprises a baseband part (hereinafter abbreviated to a BB part) 110 and a radio frequency part (hereinafter simply called an RF part) 130. The BB part 110 is for controlling transmission data signal and for demodulating received data signal. The RF part 130 is for transmitting and receiving radio waves (GFSK waves).

The BB part 110 comprises a central processing unit (CPU) 111, an interface (UART: Universal Asynchronous Receiver Transmitter) 112, a random access memory (RAM) 113, a memory controller 114, and a radio interface portion 115. The radio interface portion 115 has a Gaussian filter (GF) 116 and a clock recovery circuit 117.

The CPU 111 is controlled by an external host 150 connected to the interface 112. The CPU 111 reads/writes information from/in an external memory device (or a nonvolatile memory, e.g. a flash memory) 170 by the means of the memory controller 114. The external memory device 170 memorizes modulation coefficients mentioned later and serves as an actual part of the BB part 110. The external memory device 170 may be replaced by an internal nonvolatile memory provided in the BB part 110.

The host 150 supplies the transmission data signal to the Gaussian filter 116 of the radio interface portion 115 through the interface 112. The Gaussian filter 116 outputs the transmission data signal as an analog modulation signal (or a baseband signal) with two voltage levels corresponding to binary "0" and "1".

The RF part 130 comprises a voltage controlled oscillator (VCO) 131, a clock 132, a phase locked loop (PLL) 133, a phase discriminator (PD) 134, a charge pump 135, a power amplifier (PA) 136, a duplexer 137, an antenna 138, a low noise amplifier (LNA) 139, a multiplier 140, a band pass filter (BPF) 141, an amplifier set 142, and a deviation detector (or a demodulator) 143.

The analog modulation signal from the Gaussian filter 116 of the BB part 110 is supplied to the VCO 131 to control frequency deviation of a transmission signal transmitted from the RF part 130. The VCO 131 oscillates with a carrier frequency (or a center frequency) according to a control voltage supplied from the charge pump 135 when the analog modulation signal is not supplied from the BB part 110. The VCO 131 further deviates the carrier frequency toward a higher frequency side or a lower frequency side in response to voltage of the modulation signal supplied from the Gaussian filter 116 to produce a transmission (or modulated) signal.

The PLL 133 divides a clock signal from the clock 132 with a predetermined dividing ratio to produce a reference signal. The PLL 133 further divides the output signal (with the carrier frequency) of the VCO 131 to be comparable with reference signal. The PLL 133 periodically changes a dividing ratio for the output signal of the VCO 131 to execute the frequency hopping (or changing) of the carrier frequency. The PLL changes the dividing ration at regular intervals under the control of the CPU 111. The PLL 133 supplies the two divided signals to the phase discriminator 134.

The phase discriminator 134 compares the two divided signals from the PLL 133 with each other and supplies a difference signal representative of difference between them to the charge pump 135.

The charge pump 135 changes the control voltage supplied to the VCO 131 according to the difference signal from the phase discriminator 134.

Thus, the VCO 131, the clock 132, the PLL 133, the phase discriminator 134 and the charge pump 135 periodically change the center frequency of the VCO 131 and keep it in each period. Thus, the VCO produces the carrier frequency taking one of hopping frequencies. In other words, the carrier frequency is changed into one of the hopping frequencies at the regular intervals.

The power amplifier 136 amplifies the transmission signal from the VCO 131 and supplies an amplified transmission signal to the duplexer 137. The duplexer 137 supplies the amplified transmission signal from the power amplifier 136 to the antenna 138. The antenna 138 transmits the amplified transmission signal from the duplexer 137 to the outside.

On the other hand, a received signal received by the antenna 138 travels to the low noise amplifier 139 through the duplexer 137.

The low noise amplifier 139 low-noise amplifies the received signal and supplies an amplified received signal to the multiplier 140.

The multiplier 140 multiplies the received signal from the low noise amplifier 139 and supplies a multiplied signal to the band pass filter 141.

The band pass filter 141 removes frequency components other than a predetermined frequency band from the multiplied signal supplied from the multiplier 140. That is, the band pass filter 141 passes frequency components belonging to the predetermined frequency band of the multiplied signal as a filtered signal. The filtered signal is supplied to the amplifier set 142.

The amplifier set 142 amplifies the filtered signal at a predetermined gain and supplies an amplified filtered signal to the deviation detector 143.

The deviation detector 143 demodulates the amplified filtered signal to detect data from the amplified filtered signal. The deviation detector 143 supplies the detected data to the clock recovery circuit 117 of the BB part 110 as detected data signal.

Figure 6:
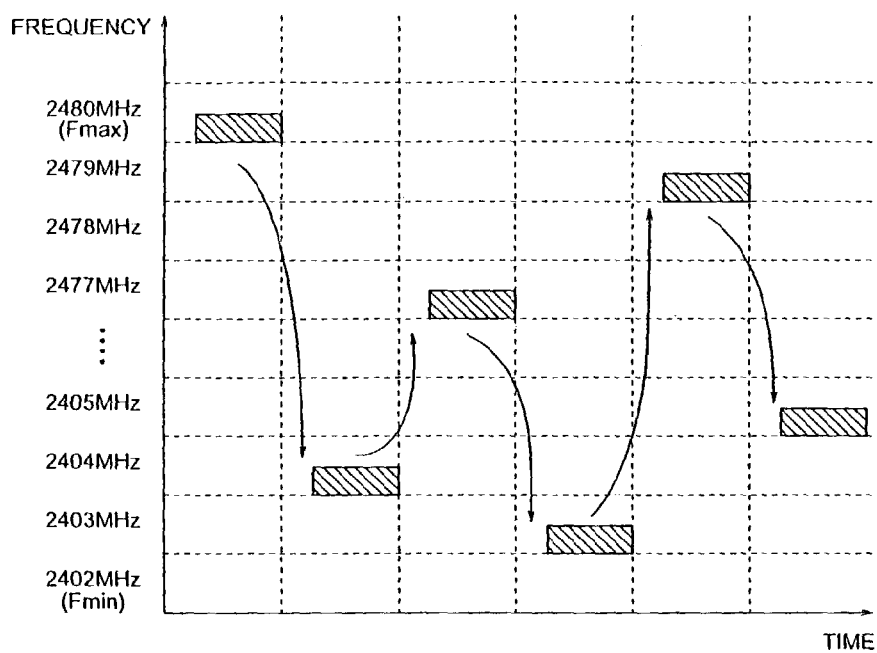
FIG. 6 is a timing chart for describing a frequency hopping operation in the device of FIG. 5.

As mentioned above, the wireless device 100 of FIG. 5 adopts a frequency hopping spectrum spreading modulation communication method. This method periodically changes the carrier frequency (or the center frequency of the transmission signal) as illustrated in FIG. 6. In FIG. 6, the carrier frequency can take one of hopping frequencies from 2402 to 2480 MHz. The periodic change of the carrier frequency is performed by changing the dividing ration for dividing the output signal of the VCO 131 in the PLL 133 as described above.

The VCO 131 has characteristics that the frequency deviation becomes large according to increase of the carrier frequency on condition the modulation signal has constant voltage amplitude. To compensate the frequency deviation characteristics, the wireless device 100 utilizes characteristics that the frequency deviation depends on the voltage amplitude of the modulation signal.

Figure 7:
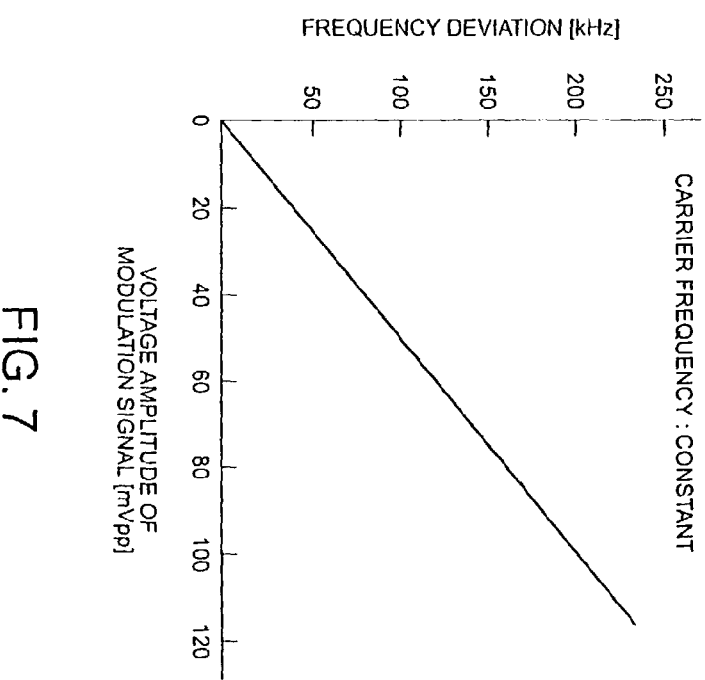
FIG. 7 is a graph of frequency deviation against voltage amplitude of a modulation signal when carrier frequency is constant.
Figure 8:
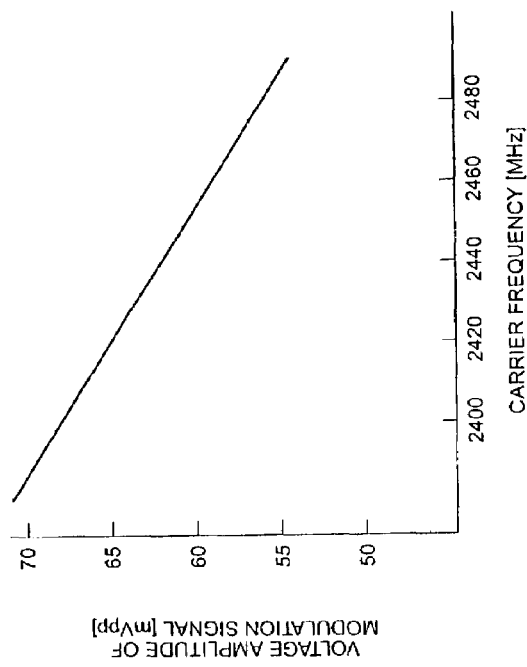
FIG. 8 is a graph of required voltage amplitude of the modulation signal against the carrier frequency.

FIG. 7 shows an example of a relation ship between the voltage amplitude of the modulation signal impressed on the VCO 131 and the frequency deviation when the carrier frequency is fixed. As shown in FIG. 7, the frequency deviation linearly increases with increase of the voltage amplitude of the modulation signal. Therefore, the frequency deviation of the transmission signal is evened or equalized by reducing the voltage amplitude with the increase of the carrier frequency as illustrated in FIG. 8.

Relationships between the hopping frequencies and voltage amplitude of the modulation signal suitable for the hopping frequencies are found as follows.

Figure 9:
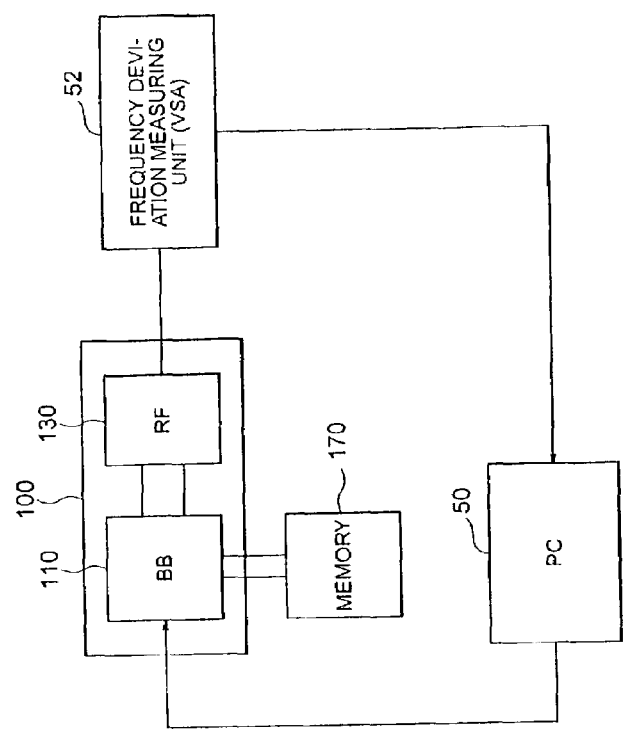
FIG. 9 is a block diagram of a measuring system for measuring the frequency deviation.

First, as shown in FIG. 9, a personal computer (PC) 50 for the measurement is connected to the wireless device 100. The host 150 may be used instead of the personal computer 50. Moreover, a frequency deviation measuring unit (VSA) 52 is connected to the wireless device 100 in place of the antenna 138. The frequency deviation measuring unit 52 is further connected to the personal computer 50.

Next, the personal computer 50 gives a measuring data set to the BB part 110 of the wireless device 100 and directs the wireless device 100 to transmit the measuring data set. The frequency deviation measuring unit 52 measures the frequency deviation of the transmission signal including the measuring data set and supplies a measuring result to the personal computer 50. The personal computer 50 further makes the wireless device 100 transmits the transmission signal with different carrier frequency to obtain another measuring result. The personal computer 50 performs calibration regarding the frequency deviation for each hopping frequency in response to the measuring results from the frequency deviation measuring set 52.

Figure 10:
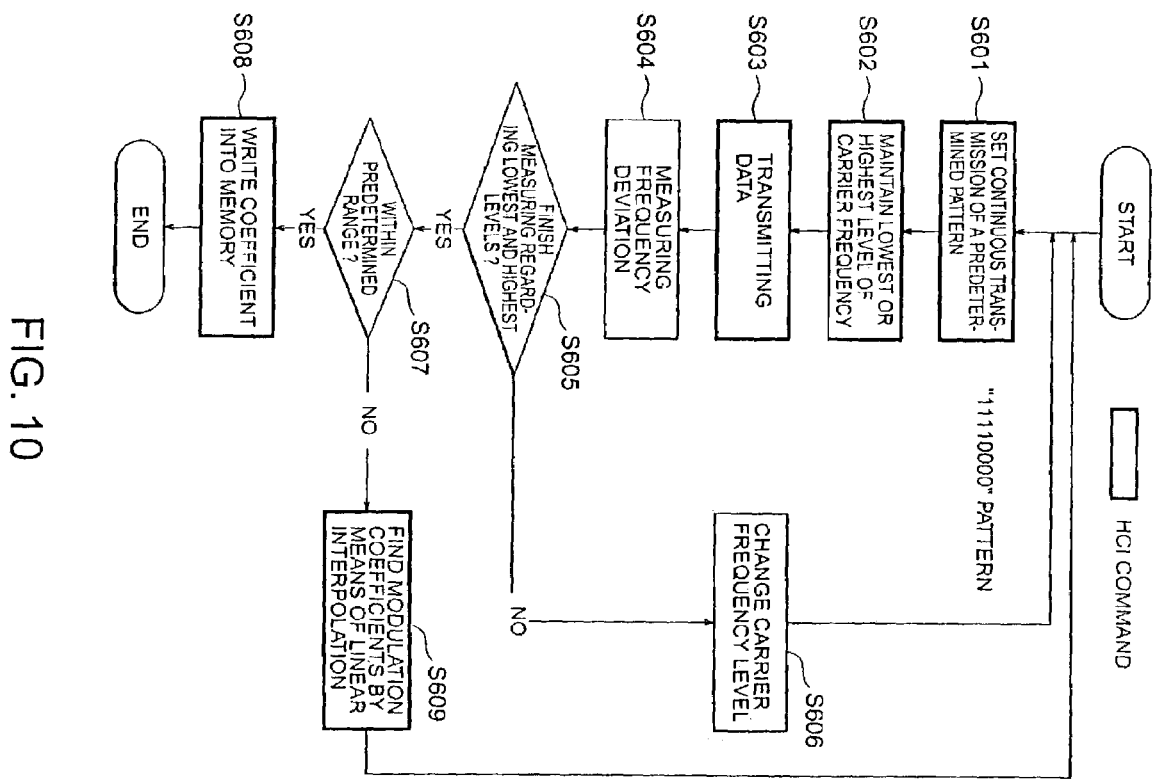
FIG. 10 is a flowchart for describing an operation of the measuring system of FIG. 9.

Referring to FIG. 10, the description will be made about the calibration regarding the frequency deviation in the personal computer 50. Only two points corresponding to the lowest hopping frequency and the highest hopping frequency are measured here. This is because the frequency deviation has the maximum value at one of the points and the minimum value at the other point.

Figure 11:
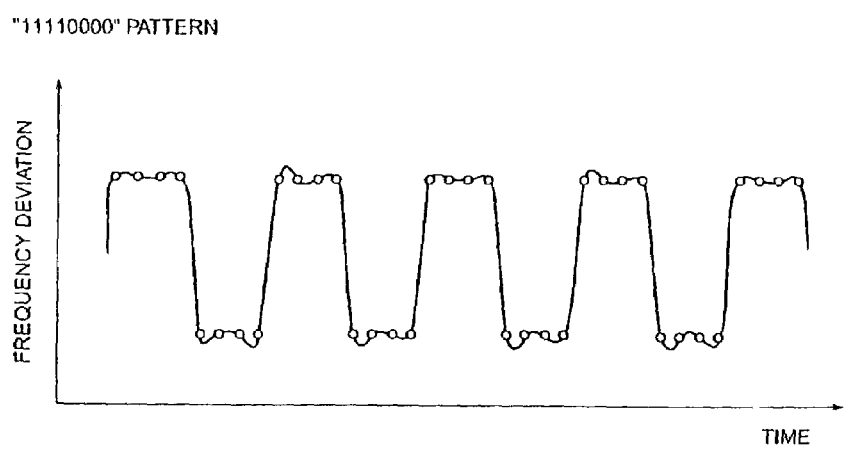
FIG. 11 is an example of a waveform of an analog signal representing "11110000" pattern.

In a step S601, the personal computer 50 sets the wireless device 100 continuously (or repeatedly) transmitting a predetermined pattern as the transmission data set. For instance, the Bluetooth standards define a pattern of "11110000" as the predetermined pattern. FIG. 11 shows a waveform of an analog signal representing the "11110000" pattern. The pattern of "11110000" is also used for measuring the maximum output of the Gaussian filter 116 of the BB part 110.

When the transmission data is set from the personal computer 50 to the wireless device 100, the amplitude of the predetermined pattern (i.e. modulation voltage) is set to the personal computer 50. Herein a concept "modulation coefficient" is introduced. The modulation voltage is set by the use of this modulation coefficient. The modulation coefficient can take a value within a predetermined coefficient range. For instance, the coefficient range is from "0" to "1023". In this case, the modulation voltage (or peak-to-peak amplitude) is assumed to be 60 mVpp when "512", which is the middle value, is set. Then, the amplitude voltage can be changed from "0" to "120" mVpp. In this embodiment, the term of "calibration" means that modulation coefficients are found for all hopping frequencies. In the step S601, the middle value "512" is set as an initial value regardless of the carrier frequency because no modulation coefficient has been found yet. The setting of the modulation coefficient is made by storing the modulation coefficient into a register of the Gaussian filter 116 as mentioned later.

Next, the personal computer 50 directs the wireless device 100 to keep the lowest or the highest hopping frequency in a step S602. This is made to stop the frequency hopping of the carrier frequency. If the wireless device 100 normally operates and executes the frequency hopping, it is difficult to measure the frequency deviation correctly.

When the above mentioned setting is finished, the personal computer 50 makes the wireless device 100 begin the transmission of the transmission data in a step S603. The wireless device 100 begins a continuous transmission of the predetermined pattern according to the direction from the personal computer 50.

In a step S604, the frequency deviation measuring unit 52 measures a value of the frequency deviation of the transmission signal (GFSK wave) transmitted from the wireless device 100. When the frequency deviation measuring unit 52 finishes the measurement of the frequency deviation value, it notifies the measuring result to the personal computer 50.

Upon receiving the measuring result, the personal computer 50 judges whether the measurement for both of the lowest and the highest hopping frequencies is finished or not in a step S605. If the measurement for one of the lowest and the highest hopping frequencies is not finished, the personal computer 50 changes the carrier frequency into the other hopping frequency in a step S606. Then the step S606 returns to the step S601 and the steps S601 to S605 are performed again.

On the other hand, the step S605 goes to a step S607 when the measurement for both of the lowest and the highest hopping frequencies is finished. In the step S607, the personal computer 50 judges whether the frequency deviation values corresponding to the lowest and the highest hopping frequencies are within a predetermined range narrower than the prescribed (or permissible) range decided (or permitted) by the radio communication standards. The predetermined range has widths of several kilohertz at both sides of the center. For instance, the predetermined range is decided at 160±5 kHz when the prescribed range decided by the Bluetooth standards is a range of 140-175 kHz.

When the frequency deviation values corresponding to the lowest and the highest hopping frequencies are included in the predetermined range, the step S607 goes to a step S608.

In the step S608, the personal computer 50 decides to commonly use the modulation coefficient of "512" for all hopping frequencies and writes the modulation coefficient of "512" into the external memory device 170 in a lump to relate it with each hopping frequency. Thus, the calibration is finished.

On the other hand, when one or both of the frequency deviation values corresponding to the lowest and the highest hopping frequencies exceeds the predetermined range, the step S607 goes to a step S609.

In the step S609, personal computer 50 finds new modulation coefficients corresponding to all of the hopping frequencies by means of linear interpolation. Then the personal computer 50 picks up two modulation coefficients corresponding to the lowest and the highest hopping frequencies from the new modulation coefficients. The personal computer 50 furthermore sets the picked modulation coefficients to the wireless communication device 100 to execute the steps S601 to S606 by using them for a second time. That is, the steps S601 to S606 are executed again by the use of the picked modulation coefficients instead of "512".

In the step S607 at the second time, when the personal computer 50 judges that the frequency deviation values corresponding to the lowest and the highest hopping frequencies are included in the predetermined range, the step S607 goes the step S608. In the step S608, the personal computer 50 writes the modulation coefficients found at the step S609 mentioned above into the external memory device 170 in a lump to individually relate them with the hopping frequencies. Thus, the calibration is finished.

If one or both of the frequency deviation values corresponding to the lowest and the highest hopping frequencies exceeds the predetermined range in the step S607 at the second time, the step S607 goes to the step S609 again. Then, the personal computer 50 further finds new modulation coefficients on the basis of the measuring results of the second time.

The above mentioned operation is repeated until the frequency deviation values of the last measuring results are included in the predetermined range.

According to this embodiment, as mentioned above, the modulation coefficients for all hopping frequencies can be found in a lump by the calibration method.

Additionally, the steps S601, S602, S603, S608 and S609 which are depicted by bold lines are steps that the personal computer 50 controls the wireless device 100. In other words, these steps are that the wireless device 100 is controlled from the outside. These steps are executed by means of HCI (Host Controller Interface) commands. That is, the calibration is executed by the control from the outside of the wireless device 100. The HCI means a communication protocol between the host 150 and a host controller (here, the wireless device 100 corresponds). The HCI commands are used for directing the host controller from the host 150.

Next, the description will be made about the linear interpolation in the step S609 with referring to FIGS. 12, 13A and 13B.

FIG. 12 shows an example of a result of measuring relation ships between the carrier frequency of VCO 131 and the frequency deviation when the modulation voltage is constant. As easily understood from FIG. 12, the value of the frequency deviation linearly decreases according to increase of the carrier frequency generally. Therefore, the frequency deviation characteristics are found by the liner interpolation if the frequency deviation values corresponding to the lowest and the highest hopping frequencies are measured. That is, when the linear interpolation is applied to the measuring results of the frequency deviation measuring unit 52, the frequency deviation characteristics related to the hopping frequencies of the wireless device 100 are obtained. FIG. 13A shows the result of the linear interpolation.

In FIG. 13A, the frequency deviation value corresponding to the lowest hopping frequency is represented by "fa" while the frequency deviation value corresponding to the highest hopping frequencies is represented by "fb". A target of the frequency deviation is represented by "f0". The modulation coefficient corresponding to the lowest hopping frequency is represented by "Ca" while the modulation coefficient corresponding to the highest hopping frequencies is represented by "Cb".

The new modulation coefficients Ca' and Cb' corresponding to the lowest and the highest hopping frequencies are given by $$Ca' = Ca \times f0/fa \qquad (1)$$

and $$Cb' = Cb \times f0/fb \qquad (2).$$

Each of remaining new modulation coefficients corresponding to the remaining levels is given by $$Ci' = (Fi - Fmin)/(Fmax - Fmin) \times (Cb' - Ca') + Ca' \qquad (3)$$

wherein, Fi represents an i-th hopping frequency (or an i-th channel), Ci' represents the new modulation coefficient corresponding to the i-th hopping frequency Fi, and Fmin and Fmax represent the lowest and the highest hopping frequencies.

By the use of the above mentioned three equations (1), (2) and (3), the new modulation coefficients for all hopping frequencies are found in a lump.

A concrete example is explained below. Here, it is assumed that Fmin=2402 MHz, Fmax=2480 MHz, Ca=512, Cb=512, fa=140 kHz, fb=175 kHz and f0=160 kHz. The modulation coefficient is possible to take an integer of "0" to "1023" as mentioned above.

At first, the new modulation coefficients Ca' and Cb' corresponding to the lowest and the highest hopping frequencies are found by the use of the equations (1) and (2) as follows. However, a fraction below decimal point is founded off in the following equations.

$$Ca' = 512 \times 160/140 = 585$$

$$Cb' = 512 \times 160/175 = 468$$

The remaining modulation coefficients corresponding to the remaining hopping frequencies are found by the use of the equation (3) as follow.

$C2'$(corresponding to the hopping frequency of 2403 MHz)
$= (2403 - 2402)/(2480 - 2402) \times (468 - 585) + 585$
$= 584$ $C3'$(corresponding to the hopping frequency of 2404 MHz)
$= (2404 - 2402)/(2480 - 2402) \times (468 - 585) + 585$
$= 582$ $C4'$(corresponding to the hopping frequency of 2405 MHz)
$= (2405 - 2402)/(2480 - 2402) \times (468 - 585) + 585$
$= 581$

...

$C40'$(corresponding to the hopping frequency of 2441 MHz)
$= (2441 - 2402)/(2480 - 2402) \times (468 - 585) + 585$
$= 527$

...

If remeasurement of the frequency deviation is made by the use of the new modulation coefficients found by the above mentioned manner, the frequency deviation is constant and equal to the target f0 regardless of the carrier frequency as illustrated in FIG. 13B.

Figures 14, 15:
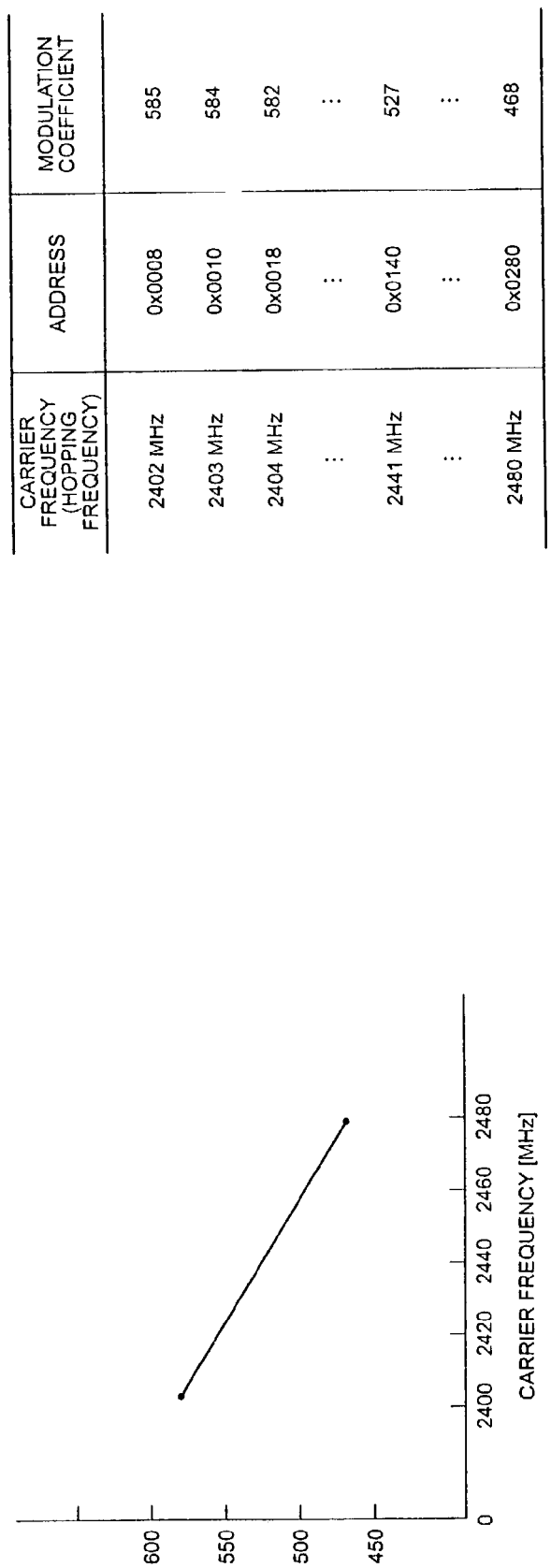
FIG. 14 is a graph of modulation coefficients against the carrier frequency.
FIG. 15 is a table showing information memorized in an external memory device connected to the device of FIG. 5.

FIG. 14 shows the relationships between the hopping frequencies and the new modulation coefficients. As understood from FIG. 14, the modulation coefficient corresponding to higher hopping frequency is larger than that corresponding to lower hopping frequency.

Each modulation coefficient takes an integral value (or a discrete value) within the coefficient range as mentioned above. Accordingly, there is a possibility that the frequency deviation values corresponding to all of the hopping frequencies are not restricted within the predetermined range in a case where the coefficient range is narrow. In other words, there is a possibility that the modulation coefficients corresponding to all of the hopping frequencies can not be found among the coefficient range which is narrow. Especially, the possibility is high when the wireless device 100 has higher rate of frequency deviation change against carrier frequency change. Therefore, it is desirable that the coefficient range is as wide as possible.

Figures 16, 17:
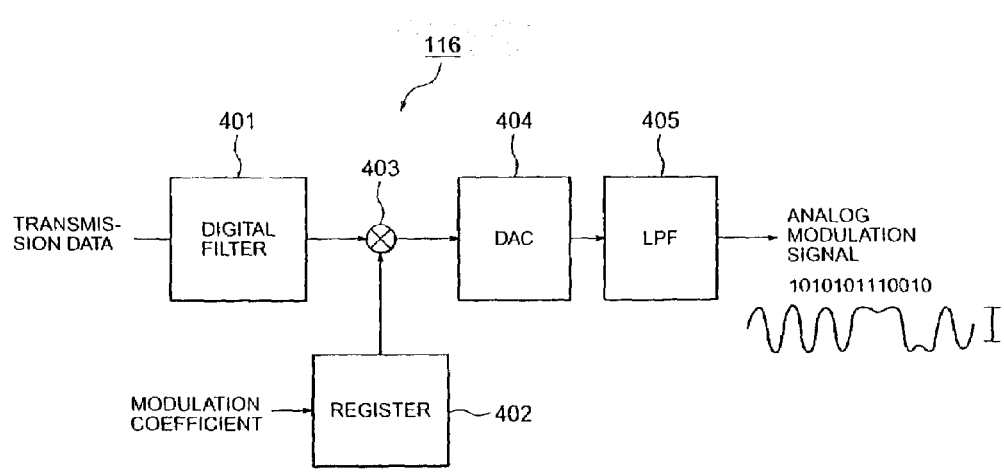
FIG. 16 shows a data sequence of a batch write command used for writing the modulation coefficients into the external memory device.
FIG. 17 is a block diagram of a Gaussian filter provided in the device of FIG. 5.

The new modulation coefficients obtained by the above mentioned manner are written into the external memory device 170 as mentioned above. This writing is performed by assigning addresses to the hopping frequencies and using a batch writing command as illustrated in FIG. 16. The batch writing command of FIG. 16 contains a write instruction, write data length designation, start address designation and the modulation coefficients corresponding the hopping frequencies.

The modulation coefficients memorized in the external memory device 170 are read out therefrom and written into the RAM 113 when the wireless device 100 starts a normal operation. In the normal operation, whenever the carrier frequency is switched (or changed into any one of the hopping frequencies) the modulation coefficient corresponding to the following hopping frequency is read out from the RAM 113 to be set in the register provided in the Gaussian filter 116. That is, whenever the CPU 112 decides the following hopping frequency which should be used in the following period of the frequency hopping, it reads out the corresponding one of the modulation coefficients on the basis of the following hopping frequency.

Next, referring to FIG. 17, the Gaussian filter 116 is described in detail.

In FIG. 17, the Gaussian filter 1.16 comprises a digital filter 401, the register 402, a multiplier 403, a digital analog converter (DAC) 404 and a low pass filter 405. The register 402 is the identical register used for memorizing the initial modulation coefficient of "512" to measure the frequency deviation.

The digital filter 401 limits a band of the digital data (or transmission data) signal supplied thereto. The register 402 stores the modulation coefficient which corresponds to the following hopping frequency (or channel) and read out from the RAM 113 under the control of the CPU 111. The multiplier 403 multiplies the band limited digital data signal from the digital filter 401 by the modulation coefficient stored in the register 402. The digital analog converter 404 converts the digital signal output from the multiplier 403 into an analog data signal. The low pass filter 405 removes high frequency components from the analog data signal from the digital analog converter 404 and supplies it to the VCO 131 as the (filtered) analog modulation signal. Thus, the analog modulation signal has the voltage amplitude adjusted according to each hopping frequency.

Here, it is assumed that the voltage amplitude of the analog modulation signal from Gaussian filter 116 is equal to 60 mVpp in an initial state (i.e. the modulation coefficient is equal to "512"). In this case, the voltage amplitude "Vai" of the analog modulation signal corresponding to each hopping frequency is as follows.

Figures 18, 19:
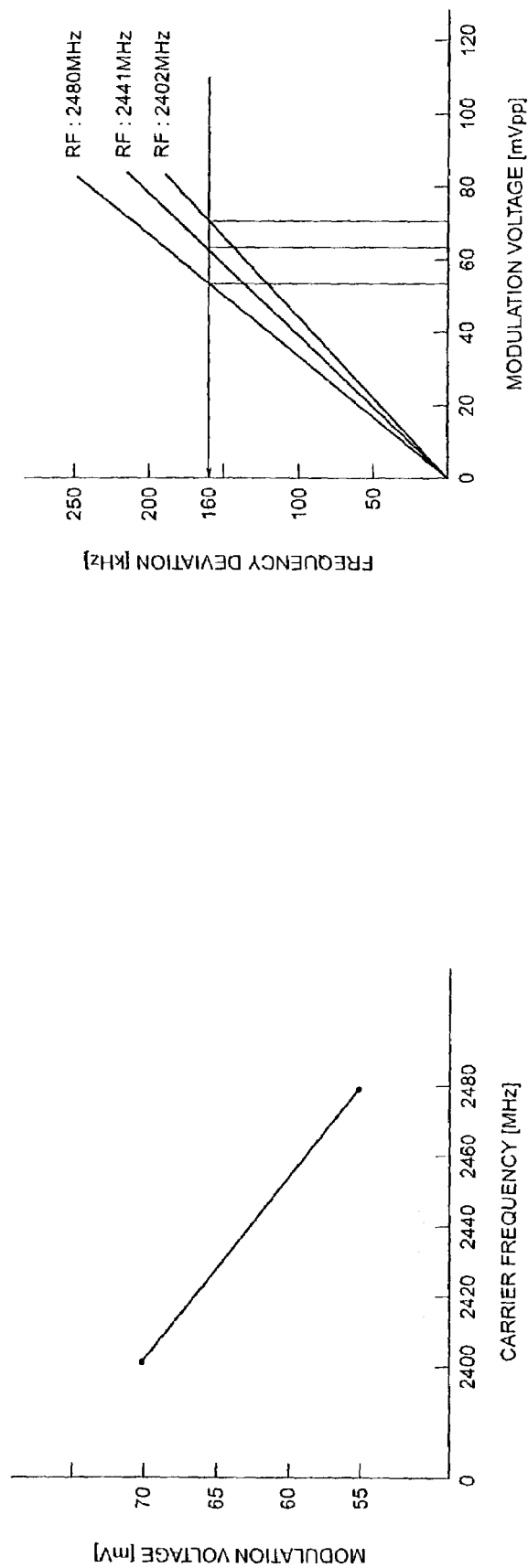
FIG. 18 is a graph of modulation voltage against the carrier frequency.
FIG. 19 is a graph of relationships between the frequency deviation and the modulation voltage regarding each hopping frequency.

$va1$ (corresponding to the hopping frequency of 2402 MHz)
$= 60 \times 585/512$
$= 68.6 \ mVpp$ $va2$ (corresponding to the hopping frequency of 2403 MHz)
$= 60 \times 584/512$
$= 68.4 \ mVpp$ $va3$ (corresponding to the hopping frequency of 2404MHz)
$= 60 \times 582/512$
$= 68.2 \ mVpp$ $va4$ (corresponding to the hopping frequency of 2405 MHz)
$= 60 \times 581/512$
$= 68.1 \ mVpp ...$ $va40$ (corresponding to the hopping frequency of 2441 MHz)
$= 60 \times 527/512$
$= 61.8 \ mVpp ...$ $va79$ (corresponding to the hopping frequency of 2480 MHz)
$= 60 \times 468/512$
$= 54.8 \ mVpp$ Above results are plotted in a graph of FIG. 18.

Regarding each hopping frequency, there are relationships as illustrated in FIG. 19 between the modulation voltage and the frequency deviation. Accordingly, the frequency deviation becomes constant as shown in FIG. 20 by adjusting the modulation voltage on the basis of the relationships illustrated in FIG. 18.

Figures 20, 21:
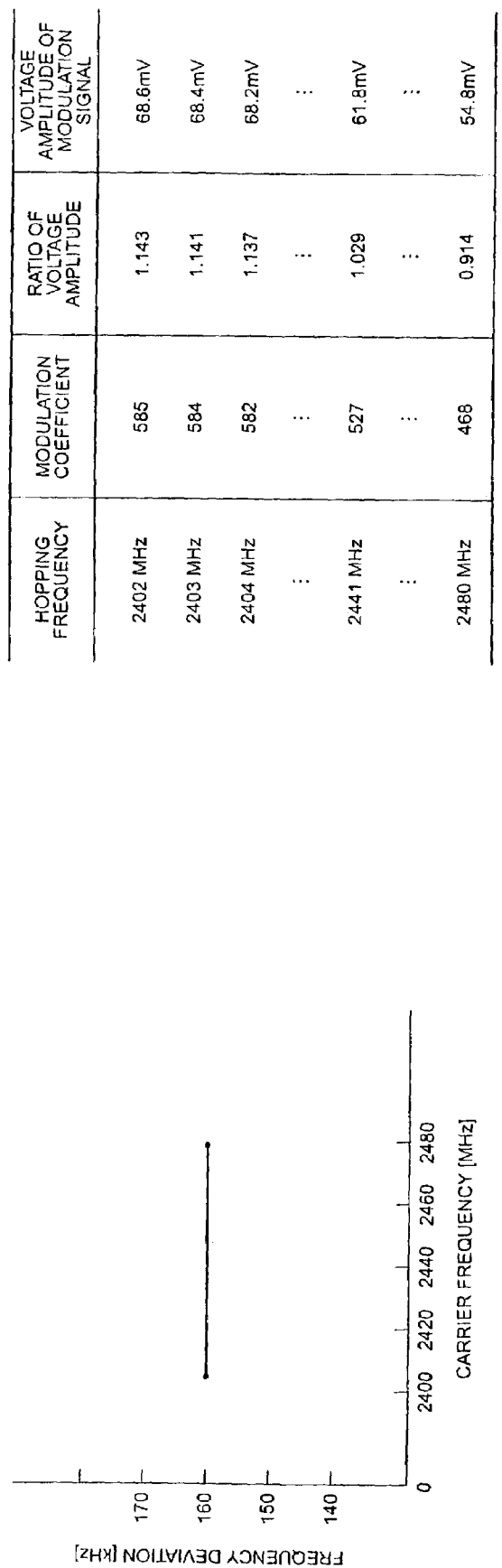
FIG. 20 is a graph of frequency deviation obtained by the device of FIG. 5 against the carrier frequency.
FIG. 21 is a table including a column for ratios of voltage amplitude to initial voltage amplitude.

FIG. 21 shows a table including a column for a ratio of the voltage amplitude to that of the initial state.

Referring to FIG. 22, the normal operation will be described below.

Upon receiving the transmission data from the host 150, the wireless device 100 executes the frequency hopping of the carrier wave at regular intervals. Whenever the CPU 111 decides the following hopping frequency, it reads out the modulation coefficient corresponding to the following frequency from the RAM 113 to store it into the register 402 of the Gaussian filter 116. The reading and storing of the corresponding modulation coefficient is performed at each hatched square of FIG. 22 and finished before the following hopping frequency is used for transmission of the transmission data.

For instance, when the wireless device 100 receives a data packet conforming to the Bluetooth standards, the CPU 111 reads out channel (or carrier frequency) designation data from the received data packet. The CPU 111 further reads out the modulation coefficient corresponding to the channel designated by the channel designation data and stores it in the register. Thus, the wireless device 100 is capable of controlling the voltage amplitude of the modulation signal according to the carrier frequency (hopping frequencies) and restricting the frequency deviation within the prescribed range regardless of the carrier frequency (or hopping frequencies).

Thus, though the wireless device 100 has simple structure, it is capable of adjusting or equalizing frequency deviation according to the carrier frequency with a high degree of accuracy. In other words, the wireless device 100 is capable of maintaining approximately uniform frequency deviation regardless of the carrier frequency. Moreover, the wireless device 100 is easy to deal with the production variation, aged deterioration and modification of the communication standards. This is because the modulation coefficients are easy to be found in a lump while the memory is easy to be rewritten.

While this invention has thus far been described in conjunction with the preferred embodiment thereof, it will readily be possible for those skilled in the art to put this invention into practice in various other manners. For example, the nonvolatile memory 170 may be provided in the BB part 110.

What is claimed is:

1. A frequency hopping communication device including a voltage controlled oscillator for producing a modulated signal having a carrier wave modulated by a modulation signal, said carrier wave having a carrier frequency changed into any one of a plurality of hopping frequencies at regular intervals, said frequency hopping communication device comprising:
a memory for memorizing a plurality of modulation coefficients related to the hopping frequencies, each modulation coefficient being related to one of the plurality of hopping frequencies, each modulation coefficient being calculated from linear interpolation of a first frequency deviation result of a first carrier frequency modulated with a predetermined pattern signal and a second frequency deviation result of a second carrier frequency modulated with the predetermined pattern signal, the calculation being performed by a processor and frequency deviation measuring unit;
a control unit connected to said memory for reading out one of the modulation coefficients as a read out modulation coefficient on the basis of a following hopping frequency from said memory when the following hopping frequency is decided; and
an adjusting portion connected to said control unit and said voltage controlled oscillator for adjusting voltage amplitude of the modulation signal by the use of the read out modulation coefficient to restrict frequency deviation of the modulated signal within a predetermined range regardless of the carrier frequency.

2. A frequency hopping communication device as claimed in claim 1, wherein the modulation signal is made from a transmission data signal and said adjusting portion comprises a multiplier for multiplying the transmission data signal by the read out modulation coefficient.

3. A frequency hopping communication device as claimed in claim 2 further comprising a Gaussian filter for supplying the modulation signal to said voltage controlled oscillator, said multiplier being provided in said Gaussian filter.

4. A frequency hopping communication device as claimed in claim 3, wherein said Gaussian filter comprises:
a digital filter for limiting a band of the transmission data signal to supply band-limited transmission data signal to said multiplier;
a digital analog converter connected to said digital filter through said multiplier for converting the band-limited transmission data signal multiplied by the read out modulation signal from said multiplier into an analog data signal; and
a low pass filter connected to said digital analog converter for filtering the analog data signal to supply filtered analog data signal to the voltage controlled oscillator as the modulation signal.

5. A method for restricting frequency deviation of a transmission signal transmitted from a frequency hopping communication device within a predetermined range regardless of hopping frequencies, said frequency hopping communication device including a voltage controlled oscillator for producing a modulated signal having a carrier wave modulated by a modulation signal, said carrier wave having a carrier frequency changed into any one of a plurality of hopping frequencies at regular intervals, said method comprising the steps of:
calculating a plurality of modulation coefficients, each related to one of the hopping frequencies, each modulation coefficient being calculated from linear interpolation of a first frequency deviation result of a first carrier frequency modulated with a predetermined pattern signal and a second frequency deviation result of a second carrier frequency modulated with the predetermined pattern signal, the calculation being performed by a processor and frequency deviation measuring unit;
memorizing the plurality of modulation coefficients related to the hopping frequencies;
reading out one of the modulation coefficients as a read out modulation coefficient on the basis of a following hopping frequency from said memory when the following hopping frequency is decided; and
adjusting voltage amplitude of the modulation signal by the use of the read out modulation coefficient to restrict frequency deviation of the modulated signal within a predetermined range regardless of the carrier frequency.

6. A method as claimed in claim 5, the modulation signal being made from transmission data signal, wherein said adjusting step comprises a step of: multiplying the transmission data signal by the read out modulation coefficient.

7. A method as claimed in claim 6 further comprises the steps of:
   limiting a band of the transmission data signal to supply band-limited transmission data signal to said multiplier;
   converting the band-limited transmission data signal multiplied by the read out modulation coefficient from said multiplier into an analog data signal; and
   filtering the analog data signal to supply filtered analog data signal to the voltage controlled oscillator as the modulation signal.

8. A method for finding modulation coefficients related to hopping frequencies, said modulation coefficients used for restricting frequency deviation of a transmission signal transmitted from a frequency hopping communication device within a predetermined range regardless of a carrier frequency, said frequency hopping communication device including a voltage controlled oscillator for producing a modulated signal having a carrier wave with the carrier frequency modulated by a modulation signal, the carrier frequency changed into any one of hopping frequencies at regular intervals, said method comprising the steps of:
   connecting a measuring computer and a frequency deviation measuring unit with said frequency hopping communication device;
   directing, from said computer, said frequency hopping communication device to maintain one of the hopping frequencies as a first carrier frequency;
   transmitting, from said frequency hopping communication device to said frequency deviation measuring unit, a first transmission signal that the first carrier frequency is modulated by the use of a predetermined pattern signal;
   measuring, at said frequency deviation measuring unit, frequency deviation of the first transmission signal to obtain a first result;
   directing, from said computer, said frequency hopping communication device to maintain another one of the hopping frequencies as a second carrier frequency;
   transmitting, from said frequency hopping communication device to said frequency deviation measuring unit, a second transmission signal that the second carrier frequency is modulated by the use of the predetermined pattern signal;
   measuring, at said frequency deviation measuring unit, frequency deviation of the second transmission signal to obtain a second result; and
   calculating the modulation coefficients by the use of linear interpolation using the first carrier frequency, the first result, the second carrier frequency and the second result.

9. A method claimed in claim 8 comprises a step of writing the modulation coefficients into a nonvolatile memory in a lump.

* * * * *